(12) United States Patent
Weigold

(10) Patent No.: US 8,309,386 B2
(45) Date of Patent: Nov. 13, 2012

(54) PROCESS OF FORMING A MICROPHONE USING SUPPORT MEMBER

(75) Inventor: Jason W. Weigold, Somerville, MA (US)

(73) Assignee: Analog Devices, Inc., Norwood, MA (US)

( * ) Notice: Subject to any disclaimer, the term of this patent is extended or adjusted under 35 U.S.C. 154(b) by 230 days.

(21) Appl. No.: 12/244,840

(22) Filed: Oct. 3, 2008

(65) Prior Publication Data
US 2009/0029501 A1  Jan. 29, 2009

Related U.S. Application Data

(63) Continuation of application No. 11/613,003, filed on Dec. 19, 2006, now Pat. No. 7,449,356, and a continuation-in-part of application No. 11/113,925, filed on Apr. 25, 2005.

(60) Provisional application No. 60/754,984, filed on Dec. 29, 2005.

(51) Int. Cl.
*H01L 21/00* (2006.01)

(52) U.S. Cl. ................... 438/53; 257/E21.002

(58) Field of Classification Search ............ 438/48, 438/51–53, 108; 257/414–416, E21.002; 381/174, 175, 191, 423, 176, 375
See application file for complete search history.

(56) References Cited

U.S. PATENT DOCUMENTS

| | | | |
|---|---|---|---|
| 4,492,825 A | 1/1985 | Brzezinski et al. | 179/111 |
| 4,524,247 A | 6/1985 | Lindenberger et al. | 179/111 |
| 4,533,795 A | 8/1985 | Baumhauer, Jr. et al. | 179/111 |
| 4,558,184 A | 12/1985 | Busch-Vishniac et al. | 179/111 |
| 4,744,863 A | 5/1988 | Guckel et al. | 156/653 |
| 4,776,019 A | 10/1988 | Miyatake | 381/174 |
| 4,825,335 A | 4/1989 | Wilner | 361/283 |
| 4,853,669 A | 8/1989 | Guckel et al. | 338/4 |
| 4,996,082 A | 2/1991 | Guckel et al. | 427/99 |
| 5,090,254 A | 2/1992 | Guckel et al. | 73/862.59 |
| 5,113,466 A | 5/1992 | Acarlar et al. | 385/88 |
| 5,134,572 A | 7/1992 | Takasaki et al. | 395/160 |

(Continued)

FOREIGN PATENT DOCUMENTS
DE  196 48 424  6/1998
(Continued)

OTHER PUBLICATIONS

*Microphone industry to expand MEMS-based offerings*, The Information Network, online <www.theinformationnet.com>, printed Feb. 1, 2005, dated Nov. 14, 2003, 2 pages.

(Continued)

*Primary Examiner* — Matthew Landau
*Assistant Examiner* — Latanya N Crawford
(74) *Attorney, Agent, or Firm* — Sunstein Kann Murphy & Timbers LLP

(57) ABSTRACT

A method of forming a microphone forms a backplate, and a flexible diaphragm on at least a portion of a wet etch removable sacrificial layer. The method adds a wet etch resistant material, where a portion of the wet etch resistant material is positioned between the diaphragm and the backplate to support the diaphragm. Some of the wet etch resistant material is not positioned between the diaphragm and backplate. The method then removes the sacrificial material before removing any of the wet etch resistant material added during the prior noted act of adding. The wet etch resistant material then is removed substantially in its entirety after removing at least part of the sacrificial material.

16 Claims, 8 Drawing Sheets

U.S. PATENT DOCUMENTS

| | | | | |
|---|---|---|---|---|
| 5,146,435 | A | 9/1992 | Bernstein | 367/181 |
| 5,178,015 | A | 1/1993 | Loeppert et al. | 73/718 |
| 5,188,983 | A | 2/1993 | Guckel et al. | 437/209 |
| 5,258,097 | A | 11/1993 | Mastrangelo | 156/644 |
| 5,303,210 | A | 4/1994 | Bernstein | 367/181 |
| 5,314,572 | A | 5/1994 | Core et al. | 156/643 |
| 5,317,107 | A | 5/1994 | Osorio | 174/52.4 |
| 5,452,268 | A | 9/1995 | Bernstein | 367/181 |
| 5,490,220 | A | 2/1996 | Loeppert | 381/168 |
| 5,573,679 | A * | 11/1996 | Mitchell et al. | 216/2 |
| 5,593,926 | A | 1/1997 | Fujihira | 437/209 |
| 5,596,222 | A | 1/1997 | Bernstein | 257/620 |
| 5,632,854 | A | 5/1997 | Mirza et al. | 438/53 |
| 5,633,552 | A | 5/1997 | Lee et al. | 310/311 |
| 5,658,710 | A | 8/1997 | Neukermans | 430/320 |
| 5,684,324 | A | 11/1997 | Bernstein | 257/415 |
| 5,692,060 | A | 11/1997 | Wickstrom | 381/169 |
| 5,740,261 | A | 4/1998 | Loeppert et al. | 381/168 |
| 5,817,539 | A | 10/1998 | Werner | 438/50 |
| 5,870,482 | A | 2/1999 | Loeppert et al. | 381/174 |
| 5,888,845 | A * | 3/1999 | Bashir et al. | 438/53 |
| 5,923,995 | A | 7/1999 | Kao et al. | 438/460 |
| 5,939,633 | A | 8/1999 | Judy | 73/514.32 |
| 5,956,292 | A | 9/1999 | Bernstein | 367/140 |
| 5,960,093 | A | 9/1999 | Miller | 381/324 |
| 6,012,335 | A * | 1/2000 | Bashir et al. | 73/724 |
| 6,128,961 | A | 10/2000 | Haronian | 73/774 |
| 6,140,689 | A | 10/2000 | Scheiter et al. | 257/414 |
| 6,243,474 | B1 | 6/2001 | Tai et al. | 381/174 |
| 6,249,075 | B1 | 6/2001 | Bishop et al. | 310/338 |
| 6,324,907 | B1 | 12/2001 | Halteren et al. | 438/53 |
| 6,426,239 | B1 | 7/2002 | Gogoi et al. | 438/53 |
| 6,505,511 | B1 | 1/2003 | Geen et al. | 73/504.12 |
| 6,522,762 | B1 | 2/2003 | Mullenborn et al. | 381/174 |
| 6,535,460 | B2 | 3/2003 | Loeppert et al. | 367/181 |
| 6,535,663 | B1 | 3/2003 | Chertkow | 385/18 |
| 6,552,469 | B1 | 4/2003 | Pederson et al. | 310/309 |
| 6,667,189 | B1 | 12/2003 | Wang et al. | 438/53 |
| 6,677,176 | B2 | 1/2004 | Wong et al. | 438/50 |
| 6,704,427 | B2 | 3/2004 | Kearey | 381/355 |
| 6,732,588 | B1 | 5/2004 | Mullenborn et al. | 73/715 |
| 6,741,709 | B2 | 5/2004 | Kay et al. | 381/175 |
| 6,743,654 | B2 * | 6/2004 | Coffa et al. | 438/52 |
| 6,753,583 | B2 | 6/2004 | Stoffel et al. | 257/416 |
| 6,781,231 | B2 | 8/2004 | Minervini | 257/704 |
| 6,812,620 | B2 | 11/2004 | Scheeper et al. | 310/324 |
| 6,816,301 | B1 | 11/2004 | Schiller | 359/290 |
| 6,829,131 | B1 | 12/2004 | Loeb et al. | 361/234 |
| 6,847,090 | B2 | 1/2005 | Loeppert | 257/418 |
| 6,857,312 | B2 | 2/2005 | Choe et al. | 73/170.13 |
| 6,859,542 | B2 | 2/2005 | Johannsen et al. | 381/174 |
| 6,870,937 | B1 | 3/2005 | Hirosaki et al. | 381/174 |
| 6,883,903 | B2 | 4/2005 | Truninger et al. | 347/71 |
| 6,912,759 | B2 | 7/2005 | Izadnegahdar et al. | 29/25.35 |
| 6,914,992 | B1 | 7/2005 | van Halteren et al. | 381/113 |
| 7,023,066 | B2 | 4/2006 | Lee et al. | 257/415 |
| 7,138,694 | B2 | 11/2006 | Nunan et al. | 257/419 |
| 7,142,682 | B2 | 11/2006 | Müllenborn et al. | 381/322 |
| 7,148,077 | B2 | 12/2006 | Fuertsch et al. | 438/53 |
| 7,166,910 | B2 | 1/2007 | Minervini | 257/704 |
| 7,280,436 | B2 * | 10/2007 | Pedersen | 367/178 |
| 2002/0079550 | A1 | 6/2002 | Daneman et al. | 257/459 |
| 2002/0102004 | A1 | 8/2002 | Minervini | 381/175 |
| 2002/0181725 | A1 | 12/2002 | Johannsen et al. | 381/174 |
| 2003/0016839 | A1 | 1/2003 | Loeppert et al. | 381/174 |
| 2003/0133588 | A1 | 7/2003 | Pedersen | 381/423 |
| 2004/0046245 | A1 | 3/2004 | Minervini | 257/704 |
| 2004/0155942 | A1* | 8/2004 | Anagnostopoulos et al. | 347/64 |
| 2004/0179705 | A1 | 9/2004 | Wang et al. | 381/175 |
| 2004/0184632 | A1 | 9/2004 | Minervini | 381/355 |
| 2004/0184633 | A1 | 9/2004 | Kay et al. | 381/355 |
| 2005/0005421 | A1 | 1/2005 | Wang et al. | 29/594 |
| 2005/0018864 | A1 | 1/2005 | Minervini | 381/396 |
| 2005/0089188 | A1 | 4/2005 | Feng | 381/396 |
| 2005/0098840 | A1 | 5/2005 | Fuertsch et al. | 257/414 |
| 2005/0102721 | A1 | 5/2005 | Barth | 977/DIG. 1 |
| 2005/0185812 | A1 | 8/2005 | Minervini | 381/355 |
| 2005/0204557 | A1* | 9/2005 | Anagnostopoulos et al. | 29/890.1 |
| 2006/0093170 | A1 | 5/2006 | Zhe et al. | 381/191 |
| 2006/0093171 | A1 | 5/2006 | Zhe et al. | 381/191 |
| 2006/0116180 | A1 | 6/2006 | Minervini | 455/575.1 |
| 2006/0157841 | A1 | 7/2006 | Minervini | 257/680 |
| 2006/0223291 | A1* | 10/2006 | Chen et al. | 438/524 |
| 2006/0233400 | A1 | 10/2006 | Ohbayashi et al. | 381/175 |
| 2006/0280319 | A1 | 12/2006 | Wang et al. | 381/172 |
| 2007/0047744 | A1 | 3/2007 | Harney et al. | 381/113 |
| 2007/0057602 | A1 | 3/2007 | Song | 310/328 |
| 2007/0058826 | A1 | 3/2007 | Sawamoto et al. | 381/174 |

FOREIGN PATENT DOCUMENTS

| | | |
|---|---|---|
| DE | 10 2004 011 148 B3 | 11/2005 |
| EP | 0596456 | 5/1994 |
| EP | 0 783 107 | 7/1997 |
| JP | 08240609 | 9/1996 |
| JP | 2002-223499 | 8/2002 |
| JP | 2005-331281 A | 12/2005 |
| WO | WO 83/01362 | 4/1983 |
| WO | WO 01/20948 | 3/2001 |
| WO | WO 01/41497 | 6/2001 |
| WO | WO 02/15636 A2 | 2/2002 |
| WO | WO 02/45463 | 6/2002 |
| WO | WO 02/052893 | 7/2002 |
| WO | WO 03/045110 A1 | 5/2003 |
| WO | WO 2005/036698 | 4/2005 |
| WO | WO 2005/086532 | 9/2005 |
| WO | WO 2005/111555 A1 | 11/2005 |
| WO | WO 2005/111555 A1 | 12/2005 |
| WO | WO 2006/116017 | 11/2006 |
| WO | WO 2007/010361 | 1/2007 |
| WO | WO 2007/029878 A1 | 3/2007 |

OTHER PUBLICATIONS

*Phone-Or/Technology*, online <file://C:\Documents%20and%20Settings\bmansfield\Local%20Settings\Temporary%20Internet%20Files\OLKE\Phone-Or%20%...>, printed Feb. 1, 2005, 2 pages.

*Liquid Crystal Polymer (LCP) Air Cavity Packages*, Quantum Leap Packaging, Inc., Brochure, 2004, 2 pages.

The International Search Report and the Written Opinion of the International Searching Authority, International Application No. PCT/US2007/060852, International Searching Authority, Jun. 6, 2007, 10 pages.

Bajdechi et al., *Single-Chip Low-Voltage Analog-to-Digital Interface for Encapsulation with Electret Microphone*, The 11th International Conference on Solid-State Sensors and Actuators, Jun. 10-14, 2001, 4 pages.

Bernstein, *MEMS Air Acoustics Research the Charles Stark Draper Laboratory*, PowerPoint Presentation, Aug. 1999, 8 pages.

Bernstein et al., *High Sensitivity MEMS Ultrasound Arrays by Lateral Ferroelectric Polarization*, Solid-State Sensor and Actuator Workshop, Jun. 4-8, 2000, 4 pages.

Chen et al., *Single-Chip Condenser Miniature Microphone with a High Sensitive Circular Corrugated Diaphragm*, IEEE, 2002, 4 pages.

Cunningham et al., *Wide bandwidth silicon nitride membrane microphones*, SPIE vol. 3223, Sep. 1997, 9 pages.

Fan et al., *Development of Artificial Lateral-Line Flow Sensors*, Solid-State Sensor, Actuator and Microsystems Workshop, Jun. 2-6, 2002, 4 pages.

Fuldner et al., *Silicon Microphones with Low Stress Membranes*, The 11th International Conference on Solid-State Sensors and Actuators, Jun. 10-14, 2001, 4 pages.

Gale et al., *MEMS Packaging*, University of Utah, Microsystems Principles, PowerPoint Presentation, Oct. 11, 2001, 8 pages.

Hall et al., *Self-Calibrating Micromachined Microphones with Integrated Optical Displacement Detection*, The 11th International Conference on Solid State Sensors and Actuators, Jun. 10-14, 2001, 4 pages.

Harper (Editor-in-Chief), *Electronic Packaging and Interconnection Handbook*, Third Edition, McGraw-Hill, Chapter 7, Section 7.2.3.1, 2000, 6 pages.

Hsieh et al., *A Micromachined Thin-film Teflon Electret Microphone*, Department of Electrical Engineering California Institute of Technology, Solid State Sensors and Actuators, Jun. 1997, 4 pages.
Kabir et al., *High Sensitivity Acoustic Transducers with Thin P+ Membranes and Gold Back-Plate*, Sensors and Actuators, vol. 78, Issue 2-3, Dec. 17, 1999, 16 pages.
Ko et al., *Piezoelectric Membrane Acoustic Devices*, IEEE, 2002, 4 pages.
Kopola et al., *MEMS Sensor Packaging Using LTCC Substrate Technology*, VTT Electronics, Proceedings of SPIE vol. 4592, 2001, pp. 148-158.
Lemkin, M., et al., *A 3-Axis Force Balanced Accelerometer Using a Single Proof-Mass*, Transducers 97, IEEE, Jun. 16-19, 1997.
M. Brauer et al., *Increasing the Performance of Silicon Microphones by the Benefit of a Complete System Simulation*, IEEE, pp. 528-531, 2004.
M. Brauer et al., *Silicon Microphone Based on Surface and Bulk Micromachining*, Journal of Micromechanics and Microengineering, 11 (2001), pp. 319-322.
Ma et al., *Design and Fabrication of an Integrated Programmable Floating-Gate Microphone*, IEEE, 2002, 4 pages.
Mason, Jack, *Companies Compete To Be Heard on the Increasingly Noisy MEMS Phone Market*, Small Times: News about MEMS, Nanotechnology and Microsystems, Jul. 18, 2003, 4 pages.
Maxim Integrated Products, *Electret Condenser Microphone Cartridge Preamplifier*, Maxim Integrated Products, Jul. 2002, 9 pages.
Neumann, Jr. et al., *A Fully-Integrated CMOS-MEMS Audio Microphone*, The $12^{th}$ International Conference on Solid State Sensors, Actuators and Microsystems Jun. 8-12, 2003, 4 pages.
Ono et al., *Design and Experiments of Bio-mimicry Sound Source Localization Sensor with Gimbal-Supported Circular Diaphragm*, The $12^{th}$ International Conference on Solid State Sensors, Actuators and Microsystems, Jun. 8-12, 2003, 4 pages.
Pedersen et al., *A Polymer Condenser Microphone on Silicon with On-Chip CMOS Amplifier*, Solid State Sensors and Actuators, Jun. 1997, 2 pages.
Polesello, Paolo, The International Searching Authority and Written Opinion of the International Searching Authority, Int'l Application No. PCT/US2006/048788, dated Aug. 20, 2007, 14 pages.
Prismark Partners LLC, *The Prismark Wireless Technology Report*, Prismark Partners LLC, Mar. 2005, 27 pages.
Rugg et al., *Thermal Package Enhancement Improves Hard Disk Drive Data Transfer Performance*, Surface Mount Technology Assn, Feb. 5, 2002, 6 pages.
S. Bouwstra et al., *Silicon Microphones—A Danish Perspective*, Journal of Micromechanics and Microengineering, 8 (1998) pp. 64-68.
Schafer et al., *Micromachined Condenser Microphone for Hearing Aid Use*, Solid-State Sensor and Actuator Workshop, Jun. 8-11, 1998, 4 pages.
Scheeper et al., *A review of silicon microphones*, Sensors and Actuators A, vol. a44, No. 1, Jul. 1994, pp. 1-11.
Sheplak et al., *A Wafer-Bonded, Silicon-Nitride Membrane Microphone with Dielectrically-Isolated, Single-Crystal Silicon Piezoresistors*, Solid-State Sensor and Actuator Workshop, Jun. 8-11, 1998, 4 pages.
Stahl, et al., *Thin Film Encapsulation of Acceleration Sensors Using Polysilicon Sacrificial Layer, Transducers '03, The $12^{th}$ International Conference on Solid State Sensors, Actuators and Microsystems*, Jun. 8-12, 2003, 4 pages.
Weigold et al., *A MEMS Condenser Microphone for Consumer Applications*, Analog Devices, Inc. and Pixtronix, Inc., Jan. 2006, 4 pages.

Yovcheva et al., *Investigation on Surface Potential Decay in PP Corona Electrets*, BPU-5: Fifth General Conference of the Balkan Physical Union, Aug. 25-29, 2003, 4 pages.
Zou et al., *A Novel Integrated Silicon Capacitive Microphone— Floating Electrode "Electret" Microphone (FEEM)*, Journal of Microelectromechanical Systems, vol. 7, No. 2, Jun. 1998, 11 pages.
The International Search Report and the Written Opinion of the International Searching Authority, International Application No. PCT/US2007/060852, International Searching Authority, Jan. 22, 2007, 10 pages.
Invitation to Pay Additional Fees and Communication Relating to the Results of the Partial International Search, International Searching Authority, Sep. 4, 2006, 5 pages.
Unknown, *MEMS and MOEMS Packaging*, Jul. 11, 2005, McGraw Hill, XP002420065, pp. 84, 96.
International Preliminary Report on Patentability;PCT/US2005/048788; Jul. 1, 2008, 7 pages.
International Search Report and Written Opinion of the International Searching Authority, PCT/US2006/014982, Apr. 25, 2006, 13 pages.
Communication Pursuant to Article 94(3)—EPC—Application No. 06 750 896.0-2225, Feb. 24, 2010.
Hoffmann Eitle, Response to Official Action dated Feb. 19, 2009—European Patent Application No. 06 849 089.5.
Communication Pursuant to Article 94(3) EPC; Application No. 06 849 089.5-1528; Feb. 19, 2009, 3 pages.
Hoffmann Eitle, Response to Official Action dated Feb. 24, 2010—Application No. 06 750 896.0-2225.
Kim & Chang, Translation of Notice of Preliminary Rejection in Korean patent application 10-2008-7018667 dated May 26, 2010, 2 pages.
Chinese Patent Office, Chinese Office Action dated Mar. 7, 2011, App. No. 200680049998.8, 4 pp.
NPA International, Inc. U.S. Office of China Sinda Intellectual Property Ltd., English explanation of Chinese Office Action dated Mar. 7, 2011, App. No. 200680049998.8, 1 page.
European Patent Office, European Search Report for European Application No. 06 750 896.0-2225, 5 pages Feb. 24, 2010.
Roy D. Marsh, Response to EP Search Report of Feb. 2010, European Patent Application No. 06 750 896.0, 7 pages.
Shusaku Yamamoto, Translation of Office Action in Japanese Patent Application 2008-547544, May 6, 2011.
Sunstein Kann Murphy & Timbers, Letter and Email Instructions to Japanese attorneys in response to Office Action in Japanese Patent Application 2008-547544, Nov. 11, 2011.
Shusaku Yamamoto, Translation of Office Action in Japanese Patent Application 2008-508951, Jan. 5, 2011.
Sunstein Kann Murphy & Timbers, Instructions to Japanese attorneys in response to Office Action in Japanese Patent Application 2008-508951, Jul. 12, 2011.
Chinese Intellectual Property Office, Office Action in Chinese Patent Application 200680049998.8, Mar. 2011.
NPA International, Letter from Chinese attorneys summarizing Office Action in Chinese Patent Application 200680049998.8, Mar. 2011.
Sunstein Kann Murphy & Timbers, Instructions to Chinese attorneys in response to Office Action of Mar. 2011 in Chinese Patent Application 200680049998.8.
European Patent Office, Search Report in European patent application No. EP 11 15 5786, Apr. 2011.
S. Avery, Response to Search Report in European patent application No. EP 11 15 5786, Jan. 26, 2012.
S. Avery, Response to Search Report in European patent application No. EP 11 15 5785, Jan. 26, 2012.

* cited by examiner

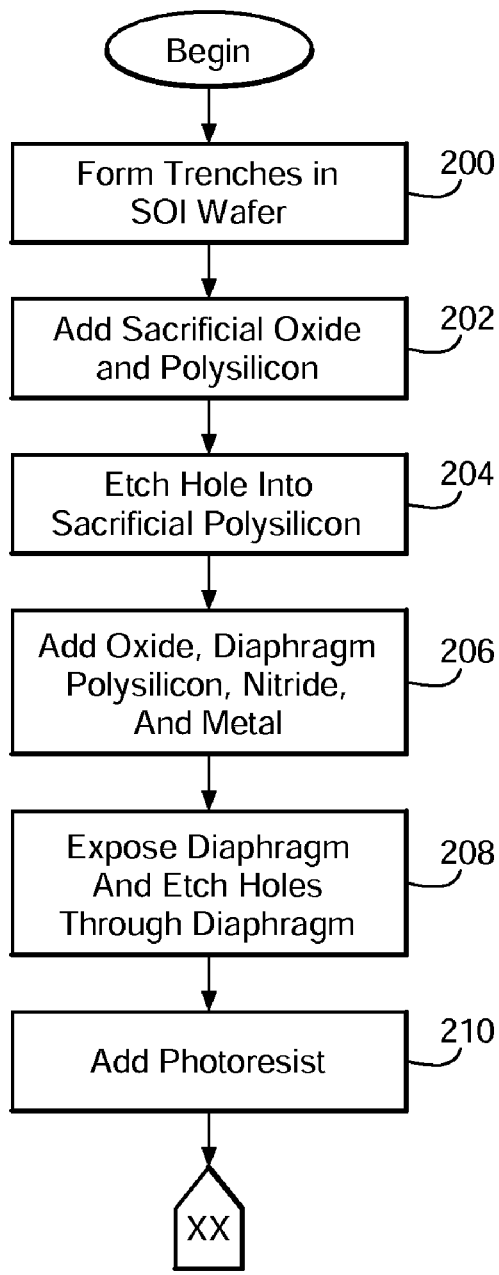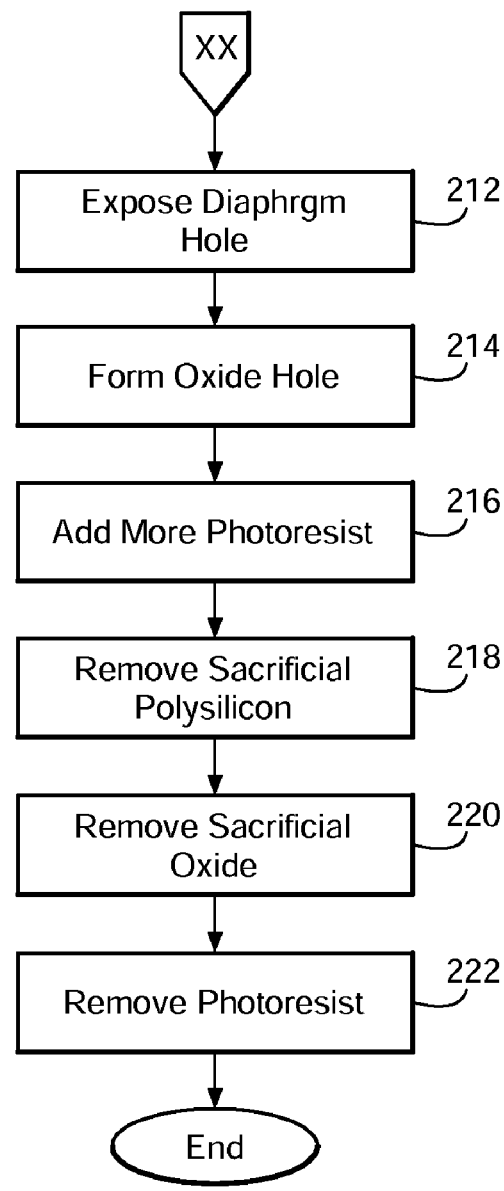
*FIG. 2A*  *FIG. 2B*

PROCESS OF FORMING A MICROPHONE USING SUPPORT MEMBER

PRIORITY

This patent application claims priority from provisional U.S. patent application No. 60/754,984, filed Dec. 29, 2005, entitled, "PROCESS OF FORMING A MICROPHONE USING SUPPORT MEMBER," and naming Jason Weigold as inventor, the disclosure of which is incorporated herein, in its entirety, by reference, and is a continuation of U.S. patent application Ser. No. 11/613,003, filed Dec. 19, 2006, entitled, "PROCESS OF FORMING A MICROPHONE USING SUPPORT MEMBER," and naming Jason Weigold as inventor, the disclosure of which is incorporated herein, in its entirety, by reference.

This patent application also is a continuation-in-part and claims priority from U.S. patent application Ser. No. 11/113,925, filed Apr. 25, 2005, entitled, "MICROMACHINED MICROPHONE AND MULTISENSOR AND METHOD FOR PRODUCING SAME," and naming John R. Martin, Timothy J. Brosnihan, Craig Core, Thomas Kieran Nunan, Jason Weigold, and Zin Zhang as inventors, the disclosure of which is incorporated herein, in its entirety, by reference.

FIELD OF THE INVENTION

The invention generally relates to microphones and, more particularly, the invention relates to methods for forming microphones.

BACKGROUND OF THE INVENTION

Some processes form microphones, such as MEMS microphones, by depositing a diaphragm material onto a sacrificial material that ultimately is removed by wet etching processes. Problems arise, however, when the surface tension of the liquid etchant causes the diaphragm to stick to its corresponding backplate. See U.S. Pat. No. 5,314,572 for an example of one method discussed for use with inertial sensors.

SUMMARY OF THE INVENTION

In accordance with one aspect of the invention, a method of forming a microphone forms a backplate, and a flexible diaphragm on at least a portion of a wet etch removable sacrificial layer. The method adds a wet etch resistant material, where a portion of the wet etch resistant material is positioned between the diaphragm and the backplate to support the diaphragm. Some of the wet etch resistant material is not positioned between the diaphragm and backplate. The method then removes the sacrificial material before removing any of the wet etch resistant material added during the prior noted act of adding. The wet etch resistant material then is removed substantially in its entirety after removing at least part of the sacrificial material.

Some embodiments release the diaphragm, which involves removing the sacrificial material and removing the wet etch resistant material. In some embodiments, the wet etch resistant material comprises a photoresist material. Moreover, the wet etch resistant material may be removed by application of a dry etch. It should be noted that the act of forming a flexible diaphragm may include a number of different things. For example, it may involved depositing a material on a sacrificial layer, or simply providing a silicon wafer on an insulator, such as the top layer of a silicon-on-insulator ("SOI") wafer.

In illustrative embodiments, the wet etch resistant material is a single, substantially contiguous apparatus, which is substantially completely removed by the process in a single act. Moreover, the wet etch resistant material may be unpatterned after the portion of wet etch resistant material is positioned between the diaphragm and the backplate.

The backplate may be formed from a number of different types of wafers, such as a part of a SOI wafer. As a further example, the sacrificial material may be formed from polysilicon or oxide.

Various processes may be executed to complete the microphone. For example, the method may form a first hole through the diaphragm, and a second hole through the sacrificial material. The second hole effectively produces a channel between a bottom surface of the diaphragm and a top surface of the backplate. To support the diaphragm, the portion of wet etch resistant material substantially fills the channel. In some embodiments, the wet etch resistant material substantially completely fills the first hole even when the sacrificial material is removed.

In accordance with another embodiment of the invention, a method of forming a MEMS microphone provides an SOI wafer having a top layer, forms a sacrificial material on the top layer of the SOI wafer, and forms a diaphragm on the sacrificial material. The method also forms a hole through the diaphragm, and a channel through the sacrificial material. The hole and channel are in fluid communication, and the channel exposes a bottom surface of the diaphragm and a top surface of the top layer of the SOI wafer. The method then adds a wet etch resistant material having a first portion within the channel and a second contiguous portion that is external to channel and substantially completely fills the hole through the diaphragm. At least a portion of the sacrificial material is removed before removing any of the wet etch resistant material.

The method eventually may release the diaphragm. To that end, the wet etch resistant material illustratively is removed after removing at least part of the sacrificial material. In some embodiments, the method removes a portion of the bottom and middle SOI layers to form a backside cavity. The method also may form a backplate hole through the top layer of the SOI wafer. Illustrative embodiments ensure that the wet etch resistant material is unpatterned after the wet etch resistant material is added to the channel.

In accordance with another embodiment of the invention, a MEMS microphone apparatus has a backplate, a diaphragm having a through-hole and top and bottom sides, and a substantially contiguous, unpatterned, wet etch resistant material, between the backplate and diaphragm. The material supports the diaphragm by being in contact with both the top and bottom sides of the diaphragm. In addition, the apparatus has an air space between portions of the diaphragm and the backplate.

In accordance with other embodiments of the invention, a method of forming a MEMS microphone provides a diaphragm layer on a sacrificial layer, where the sacrificial layer is between the diaphragm layer and a substrate. Next, the method forms a wet etch resistant material between the substrate and the diaphragm, and forms a backside cavity. The method then applies a wet etch material to the sacrificial material through the backside cavity to remove at least a portion of the sacrificial layer. At least a portion of the wet etch resistant material supports the diaphragm layer after applying the wet etch material.

In some embodiments, the diaphragm layer, sacrificial layer and substrate are respective layers of a single SOI wafer.

Moreover, the act of providing may include depositing a material on the sacrificial layer to form the diaphragm.

BRIEF DESCRIPTION OF THE DRAWINGS

The foregoing advantages of the invention will be appreciated more fully from the following further description thereof with reference to the accompanying drawings wherein:

FIGS. 2A and 2B show a process of forming the microphone shown in FIGS. 1A and 1B in accordance with illustrative embodiments of the invention.

DESCRIPTION OF ILLUSTRATIVE EMBODIMENTS

In illustrative embodiments, a method of forming a microphone uses a liquid etch resistant material to prevent its diaphragm from adhering or otherwise sticking to its backplate during a liquid/wet etch step. To that end, the illustrative method forms a wet etch resistant material between the diaphragm and backplate, thus supporting the diaphragm during a wet etch step. Various embodiments eliminate patterning steps by ensuring that the liquid etch material is added and removed in relatively few steps (e.g., one or two steps for adding, and a single step for removing—no specialized patterning processes for the wet etch resistant material are necessary). Details of illustrative embodiments are discussed below.

Figure 1A:
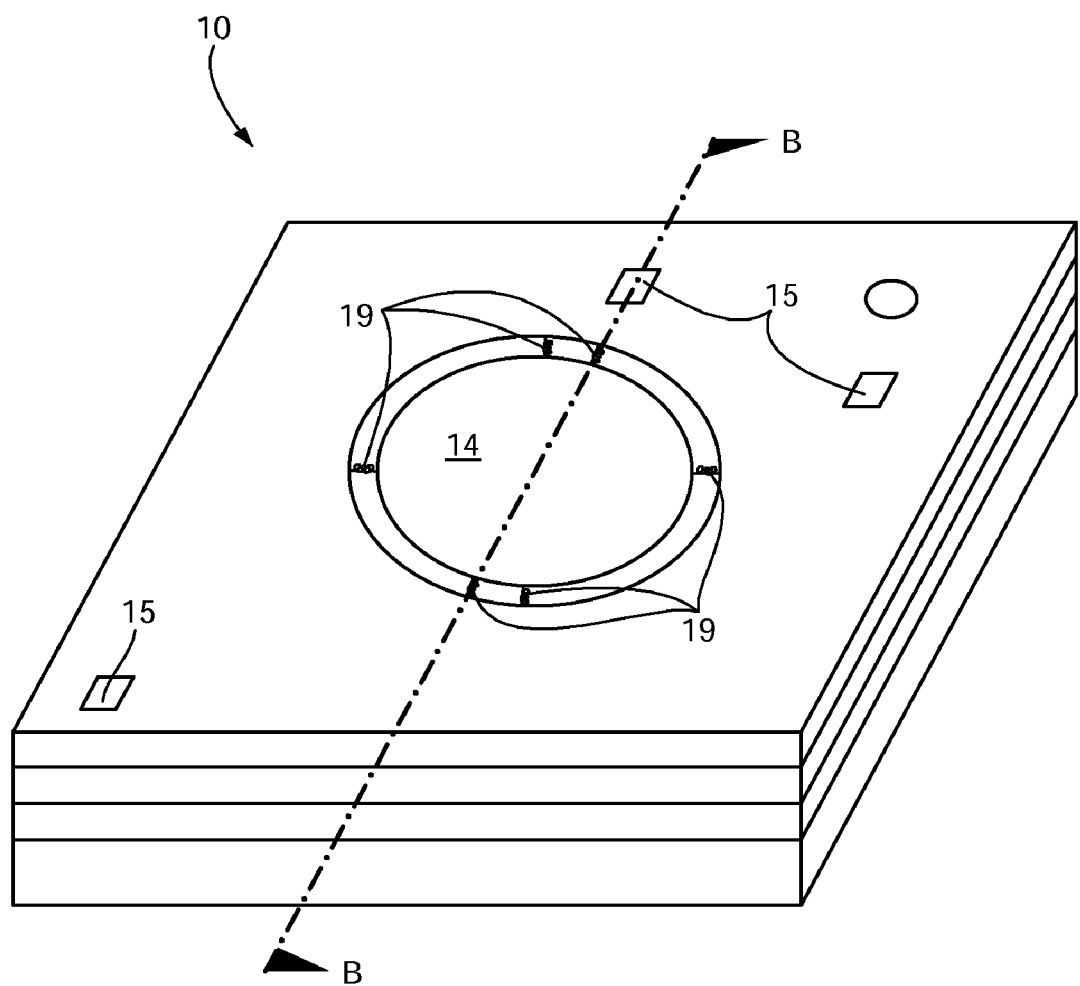
FIG. 1A schematically shows a perspective view of an unpackaged microphone that may be fabricated in accordance with illustrative embodiments of the invention.
Figure 1B:
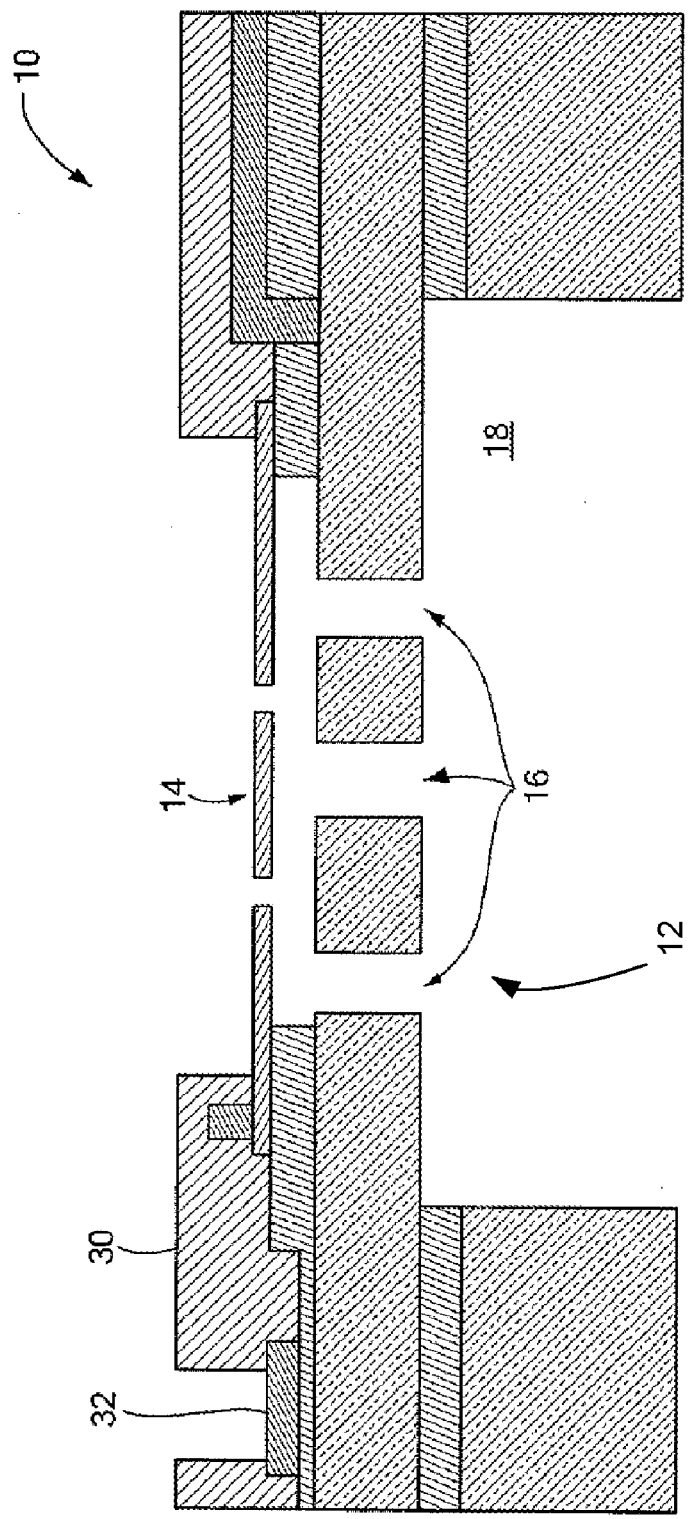
FIG. 1B schematically shows a cross-sectional view of the microphone shown in FIG. 1A.

FIG. 1A schematically shows a top, perspective view of a microphone 10 (also referred to as a "microphone chip 10") that may be fabricated in accordance with illustrative embodiments of the invention. FIG. 1B schematically shows a cross-section of the same microphone 10 across line B-B of FIG. 1A.

Among other things, the microphone 10 includes a static backplate 12 that supports and forms a capacitor with a flexible diaphragm 14. In illustrative embodiments, the backplate 12 is formed from single crystal silicon (e.g., the top layer of a silicon-on-insulator wafer), while the diaphragm 14 is formed from deposited polysilicon. Other embodiments, however, use other types of materials to form the backplate 12 and the diaphragm 14. For example, a single crystal silicon bulk wafer, or some deposited material may form the backplate 12. In a similar manner, a single crystal silicon bulk wafer, part of an silicon-on-insulator wafer, or some other deposited material may form the diaphragm 14. To facilitate operation, the backplate 12 has a plurality of through-holes 16 that lead to a backside cavity 18.

Springs 19 movably connect the diaphragm 14 to the static portion of the microphone 10, which includes the substrate.

Audio signals cause the diaphragm 14 to vibrate, thus producing a changing capacitance. On-chip or off-chip circuitry (not shown) receive (via contacts 15) and convert this changing capacitance into electrical signals that can be further processed. It should be noted that discussion of the specific microphone 10 shown in FIGS. 1A and 1B is for illustrative purposes only. Other microphone configurations thus may be used with illustrative embodiments of the invention.

FIGS. 2A and 2B show a process of forming the microphone 10 shown in FIGS. 1A and 1B in accordance with illustrative embodiments of the invention. The remaining figures illustrate various steps of this process. It should be noted that this process does not describe all steps required for forming the microphone 10. Instead, it shows various relevant steps for forming the microphone 10. Accordingly, some steps are not discussed.

Figure 3A:
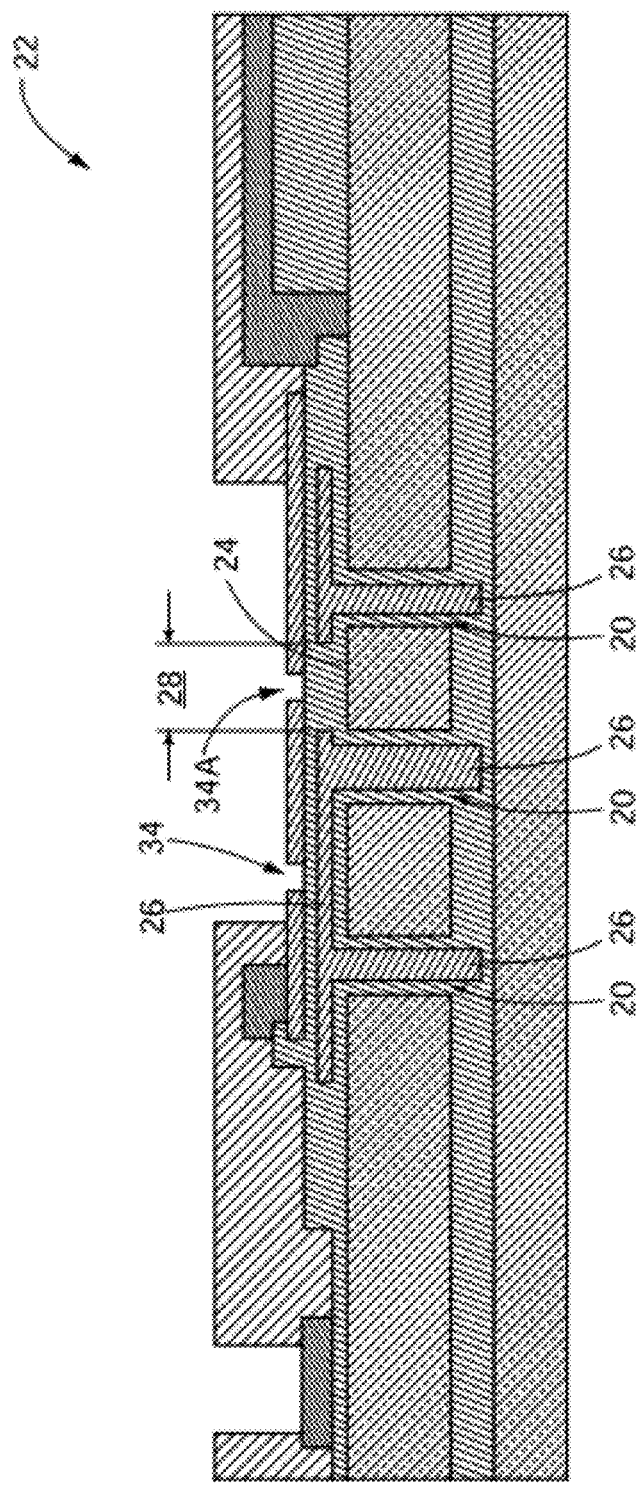
FIG. 3A schematically shows a view of the microphone during a stage of the method shown in FIG. 2A (steps 200-208).

The process begins at step 200, which etches trenches 20 in the top layer of a silicon-on-insulator wafer ("SOI wafer"). FIG. 3A schematically shows an intermediate apparatus 22 illustrating this step, as well as steps 202-208. Next, the process adds sacrificial oxide 24 to the walls of the trenches 20 and along at least a portion of the top surface of the top layer of the SOI wafer (step 202). Among other ways, this oxide 24 may be grown or deposited. Step 202 continues by adding sacrificial polysilicon 26 to the oxide lined trenches 20 and top-side oxide 24.

After adding the sacrificial polysilicon 26, the process etches a hole 28 into the sacrificial polysilicon 26 (step 204). The process then continues to step 206, which adds more oxide 24 to substantially encapsulate the sacrificial polysilicon 26. In a manner similar to other steps that add oxide 24, this oxide 24 essentially integrates with other oxides in which it comes into contact. Step 206 continues by adding an additional polysilicon layer that ultimately forms the diaphragm 14.

Nitride 30 for passivation and metal 32 for electrical connectivity also are added. For example, deposited metal may be patterned to form a first electrode for placing electrical charge on the diaphragm 14, another electrode for placing electrical charge on the backplate 12, and bond pads 15 for providing additional electrical connections. There may be electrical connections (not shown) between bond pads and the electrodes.

The process then both exposes the diaphragm 14, and etches holes 34 through the diaphragm 14 (step 208). As discussed below in greater detail, one of these holes ("diaphragm hole 34A") ultimately assists in forming a pedestal 42 that, for a limited time during this process, supports the diaphragm 14. A photoresist layer 36 then is added, completely covering the diaphragm 14 (step 210). This photoresist layer 36 serves the function of an etch mask.

Figure 3B:
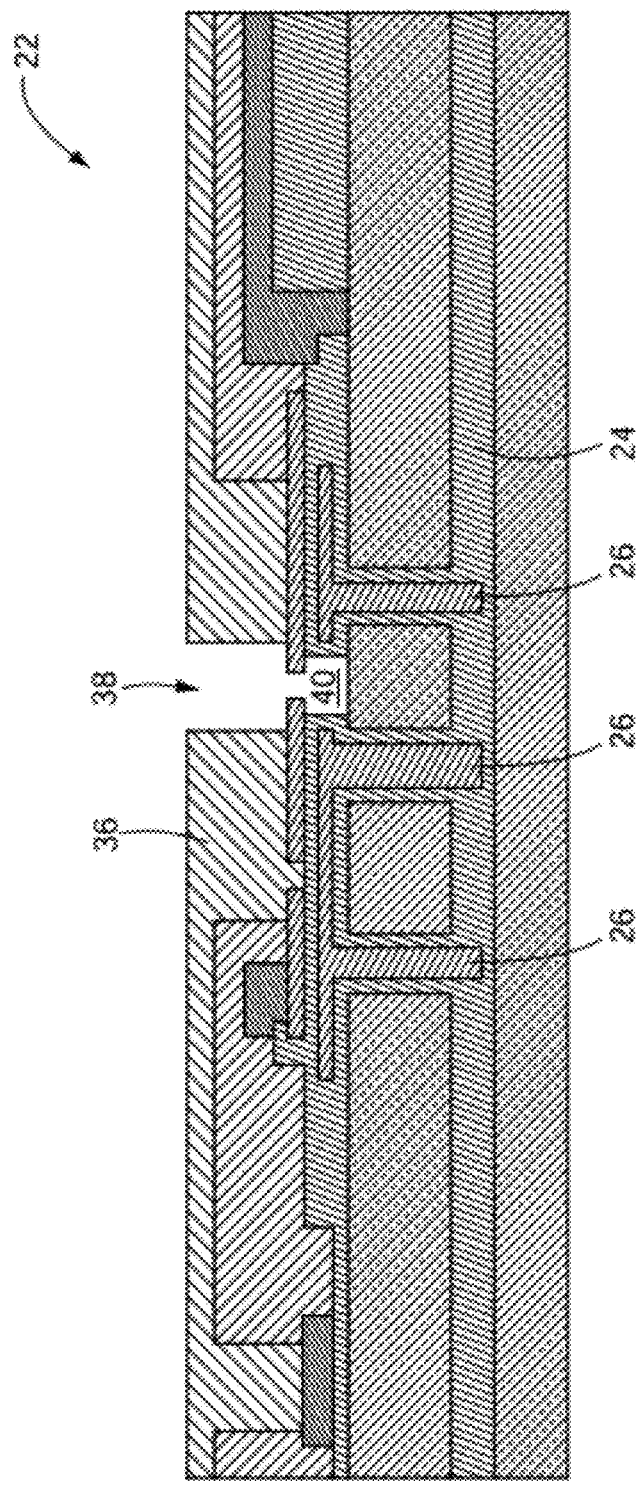
FIG. 3B schematically shows a view of the microphone during a stage of the method shown in FIG. 2A (step 214).

After adding the photoresist 36, the process exposes the diaphragm hole 34A (step 212, FIG. 3B). To that end, the process forms a hole ("resist hole 38") through the photoresist 36 by exposing that selected portion to light. This resist hole 38 illustratively has a larger inner diameter than that of the diaphragm hole 34A.

After forming the resist hole 38, the process forms a hole 40 through the oxide 24 (step 214, FIG. 3B). In illustrative embodiments, this oxide hole 40 effectively forms an internal channel that extends to the top surface of the upper SOI wafer.

It is expected that the oxide hole 40 first will have an inner diameter that is substantially equal to the inner diameter of the diaphragm hole 34A. A second step, such as an aqueous HF etch, may be used to enlarge the inner diameter of the oxide hole 40 to be greater than the inner diameter of the diaphragm hole 34A. This enlarged oxide hole diameter essentially exposes a portion of the bottom side of the diaphragm 14. In other words, at this point in the process, the channel forms an air space between the bottom side of the diaphragm 14 and the top surface of the backplate 12.

Also at this point in the process, the entire photoresist layer 36 may be removed to permit further processing. For example, the process may pattern the diaphragm 14, thus necessitating removal of the existing photoresist layer 36 (i.e., the mask formed by the photoresist layer 36). Other embodiments, however, do not remove this photoresist layer 36 until step 222 (discussed below).

Figure 3C:
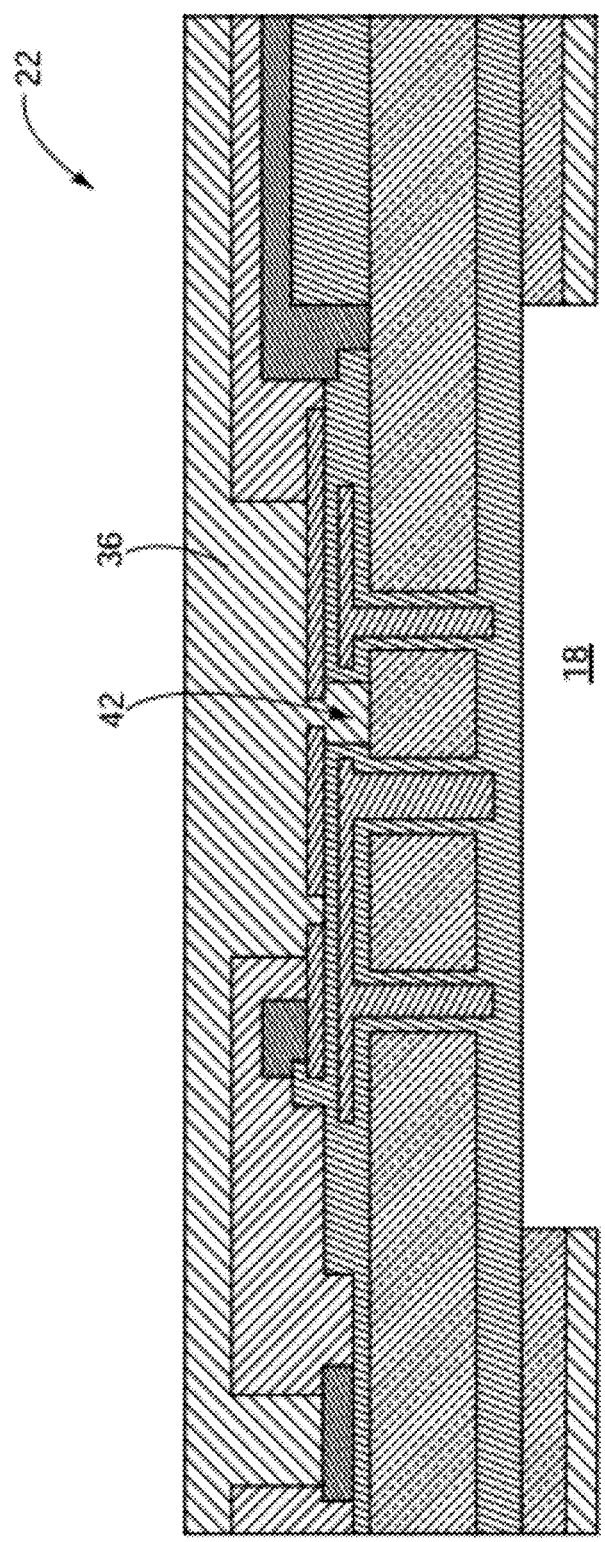
FIG. 3C schematically shows a view of the microphone during a stage of the method shown in FIG. 2A (step 216).

The process then continues to step 216, which adds more photoresist 36, to substantially fill the oxide and diaphragm holes 40 and 34 (FIG. 3C). The photoresist 36 filling the oxide hole 40 contacts the silicon of the top SOI layer, as well as the underside of the diaphragm 14 around the diaphragm hole 34A.

The embodiment that does not remove the original mask thus applies a sufficient amount of photoresist 36 in two steps (i.e., first the mask, then the additional resist to substantially fill the oxide hole 40), while the embodiment that removes the original mask applies a sufficient amount of photoresist 36 in a single step. In both embodiments, as shown in FIG. 3C, the photoresist 36 essentially acts as the single, substantially contiguous apparatus above and below the diaphragm 14. Neither embodiment patterns the photoresist 36 before the sacrificial layer is etched (i.e., removal of the sacrificial oxide 24 and polysilicon 26, discussed below).

In addition, the process may form the backside cavity 18 at this time. To that end, as shown in FIG. 3C, conventional processes may apply another photoresist mask on the bottom side of the SOI wafer to etch away a portion of the bottom SOI silicon layer. This should expose a portion of the oxide layer within the SOI wafer. A portion of the exposed oxide layer then is removed to expose the remainder of the sacrificial materials, including the sacrificial polysilicon 26.

Figure 3D:
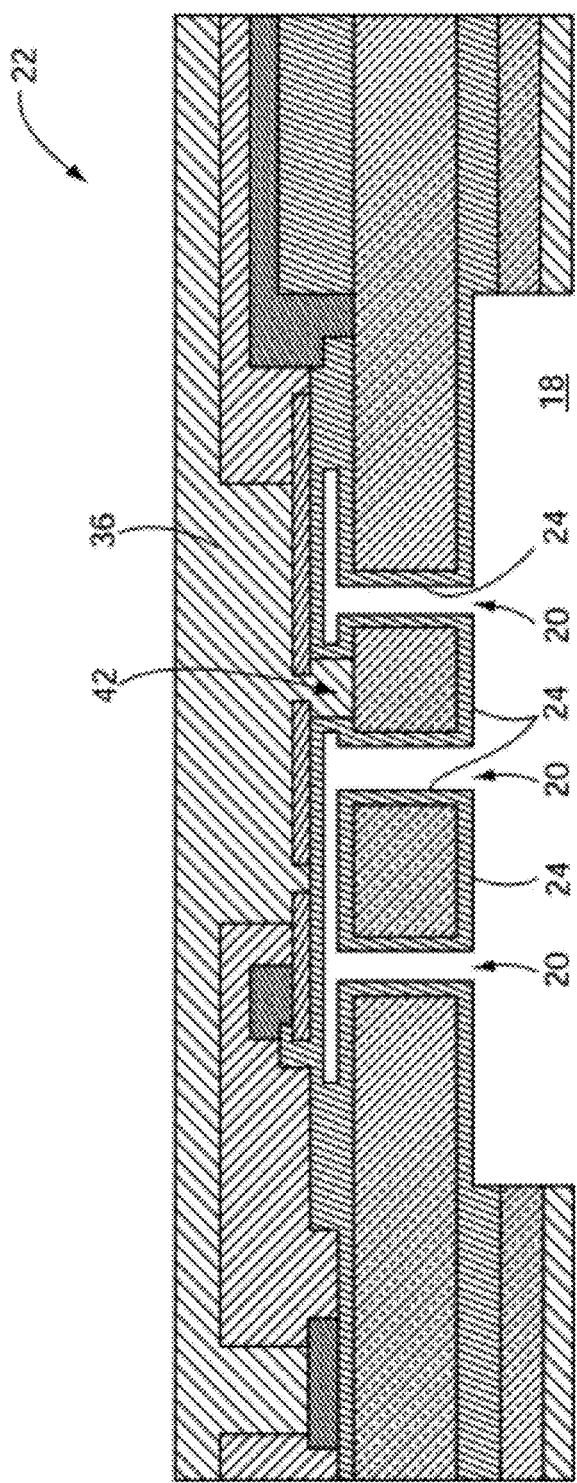
FIG. 3D schematically shows a view of the microphone during a stage of the method shown in FIG. 2A (step 218).

At this point, the sacrificial materials may be removed. To that end, the process removes the sacrificial polysilicon 26 (step 218, FIG. 3D) and then the sacrificial oxide 24 (step 220, FIG. 3E). Among other ways, illustrative embodiments remove the polysilicon 26 with a dry etch process (e.g., using xenon difluoride) through the backside cavity 18. In addition, illustrative embodiments remove the oxide 24 with a wet etch process (e.g., by placing the apparatus in an acid bath for a predetermined amount of time). Some embodiments, however, do not remove all of the sacrificial material. For example, such embodiments may not remove portions of the oxide 24. In that case, the oxide 24 may impact capacitance.

Figure 3E:
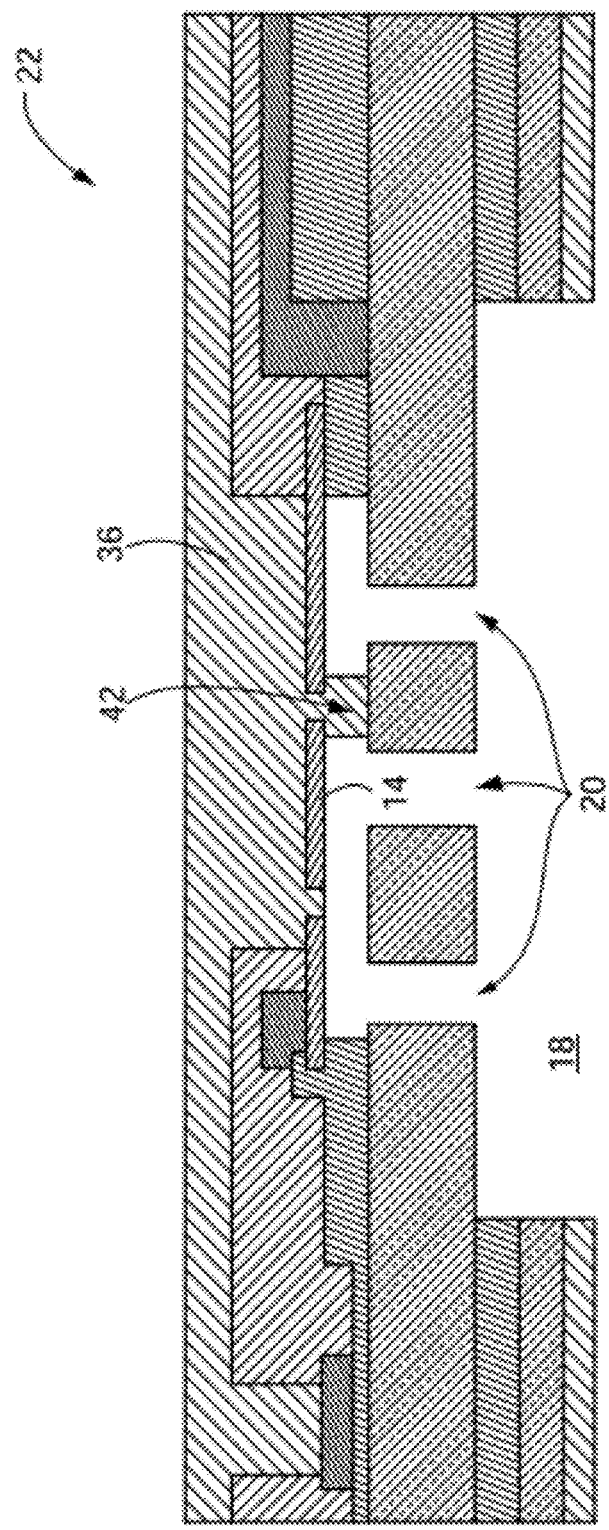
FIG. 3E schematically shows a view of the microphone during a stage of the method shown in FIG. 2A (step 220).

As shown in FIG. 3E, the photoresist 36 between the diaphragm 14 and top SOI layer supports the diaphragm 14. In other words, the photoresist 36 at that location forms a pedestal 42 that supports the diaphragm 14. As known by those skilled in the art, the photoresist 36 is substantially resistant to wet etch processes (e.g., aqueous HF process, such as those discussed above). It nevertheless should be noted that other wet etch resistant materials may be used. Discussion of photoresist 36 thus is illustrative and not intended to limit the scope of all embodiments.

Stated another way, a portion of the photoresist 36 is within an air space between the diaphragm 14 and the backplate 12; namely, it interrupts or otherwise forms a part of the boundary of the air space. In addition, as shown in the figures, this photoresist 36 extends as a substantially contiguous apparatus through the hole 34 in the diaphragm 14 and on the top surface of the diaphragm 14. It is not patterned before removing at least a portion of the sacrificial layers. No patterning steps are required to effectively fabricate the microphone 10.

To release the diaphragm 14, the process continues to step 222, which removes the photoresist 36/pedestal 42 in a single step. Among other ways, dry etch processes through the backside cavity 18 may be used to accomplish this step. This step illustratively removes substantially all of the photoresist 36—not simply selected portions of the photoresist 36.

It should be noted that a plurality of pedestals 42 may be used to minimize the risk of stiction between the backplate 12 and the diaphragm 14. The number of pedestals used is a function of a number of factors, including the type of wet etch resistant material used, the size and shape of the pedestals 42, and the size, shape, and composition of the diaphragm 14. Discussion of a single pedestal 42 therefore is for illustrative purposes.

It also should be noted that various embodiments of the present invention is not limited to any particular shape, material, or configuration of the microphone 10 or diaphragm 14. The microphone 10 may be, for example, round or square, solid or perforated by one or more holes, and/or flat or corrugated. Different diaphragm configurations might require different or additional processes from those described. For example, additional processes may be required to form holes or corrugations in the diaphragm 14.

Accordingly, stiction issues relating to surface tension of liquids should be mitigated because sacrificial layer removal processes using liquids are completed before the pedestal 42 is removed. Moreover, removing the sacrificial material through the backside cavity 18 favorably impacts microphone 10 performance by not requiring etch holes though the diaphragm 14 (to permit communication of the etching material). Specifically, as known by those in the art, it is preferable to have a diaphragm 14 with a large area to provide a stronger, more robust capacitive signal. Etching holes in the diaphragm 14 undesirably reduces the effective diaphragm area, thus reducing the effective signal. In addition, use of the backside cavity 18 eliminates the need to pattern the photoresist 36 used to support the diaphragm 14, consequently simplifying the fabrication process.

Although the above discussion discloses various exemplary embodiments of the invention, it should be apparent that those skilled in the art can make various modifications that will achieve some of the advantages of the invention without departing from the true scope of the invention.

What is claimed is:

1. A method of forming a microphone, the method comprising:
    forming a backplate by etching at least one trench into a substrate, and filling at least one trench with at first sacrificial material and a second sacrificial material;
    depositing a wet etch removable sacrificial material on the first sacrificial material and the second sacrificial material;
    forming a flexible diaphragm on at least a portion of a wet etch removable sacrificial material;
    adding a wet etch resistant material, a portion of the wet etch resistant material being positioned between the diaphragm and the backplate to support the diaphragm;
    removing the first and second sacrificial material and the wet etch removable sacrificial material before removing any of the wet etch resistant material added by the act of adding; and
    removing the added wet etch resistant material after removing at least part of the sacrificial material.

2. The method as defined by claim 1 further comprising releasing the diaphragm, releasing comprising removing the first and second sacrificial material and the wet etch removable sacrificial material and removing the wet etch resistant material.

3. The method as defined by claim 1 wherein the wet etch resistant material comprises a photoresist material.

4. The method as defined by claim 1 further comprising:
   forming a hole through the diaphragm;
   forming a channel through the first and second sacrificial material and the wet etch removable sacrificial material, the channel being in fluid communication with the hole through the diaphragm; and
   the wet etch resistant material substantially filling the channel while the sacrificial material is removed.

5. The method as defined by claim 1 wherein adding includes adding a contiguous apparatus of wet etch resistant material, substantially all of the contiguous apparatus being removed by the act of removing the added wet etch resistant material.

6. The method as defined by claim 1 wherein the wet etch resistant material is unpatterned after the portion of wet etch resistant material is positioned between the diaphragm and the backplate.

7. The method as defined by claim 1 wherein the backplate is part of a silicon-on-insulator wafer.

8. The method as defined by claim 1 wherein the wet etch removable sacrificial material comprises oxide.

9. The method as defined by claim 1 further comprising:
   forming a first hole through the diaphragm;
   forming a second hole through the first and second sacrificial material and the wet etch removable sacrificial material, the second hole producing a channel between a bottom surface of the diaphragm and a top surface of the backplate, the portion of wet etch resistant material substantially filling the channel.

10. The method according to claim 1 wherein forming a backplate comprises:
    filling at least one trench with a sacrificial material comprising sacrificial oxide.

11. The method according to claim 1 wherein forming a backplate comprises:
    filling at least one trench with a sacrificial material comprising sacrificial polysilicon.

12. A method of forming a MEMS microphone, the method comprising:
    providing a diaphragm layer on a sacrificial layer, the sacrificial layer being between the diaphragm layer and a substrate;
    forming a pedestal of wet etch resistant material between the substrate and the diaphragm;
    forming a backside cavity;
    applying a wet etch material to the sacrificial material through the backside cavity to remove at least a portion of the sacrificial layer, at least a portion of the wet etch resistant material supporting the diaphragm layer after applying the wet etch material; and
    removing substantially all of the wet etch resistant material after removing at least a portion of the sacrificial material to release the diaphragm layer.

13. The method as defined by claim 12 wherein the diaphragm layer, sacrificial layer and substrate are respective layers of a single SOI wafer.

14. The method as defined by claim 12 wherein providing comprises depositing a material on the sacrificial layer to form the diaphragm.

15. The method as defined by claim 12 wherein the wet etch resistant material is substantially unpatterned before applying the wet etch material to the sacrificial material.

16. The method according to claim 1 wherein the first sacrificial material comprises sacrificial oxide and the second sacrificial material comprises sacrificial polysilicon.

* * * * *

UNITED STATES PATENT AND TRADEMARK OFFICE
CERTIFICATE OF CORRECTION

PATENT NO. : 8,309,386 B2  
APPLICATION NO. : 12/244840  
DATED : November 13, 2012  
INVENTOR(S) : Jason W. Weigold Page 1 of 1

It is certified that error appears in the above-identified patent and that said Letters Patent is hereby corrected as shown below:

In Col. 6, line 48  
replace "at first"  
with --a first--

In Col. 6, line 53  
replace "a wet etch"  
with --the wet etch--

Signed and Sealed this  
Twelfth Day of March, 2013

Teresa Stanek Rea  
*Acting Director of the United States Patent and Trademark Office*